(12) United States Patent
Liu et al.

(10) Patent No.: US 6,795,357 B1
(45) Date of Patent: Sep. 21, 2004

(54) METHOD FOR READING A NON-VOLATILE MEMORY CELL

(75) Inventors: Zhizheng Liu, Sunnyvale, CA (US); Yi He, Fremont, CA (US); Mark W. Randolph, San Jose, CA (US); Sameer S. Haddad, San Jose, CA (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/283,590

(22) Filed: Oct. 30, 2002

(51) Int. Cl.$^7$ .................................................. G11C 7/00

(52) U.S. Cl. ....................................... 365/203; 365/196

(58) Field of Search ................................. 365/196, 203

(56) References Cited

U.S. PATENT DOCUMENTS 6,442,070 B1 * 8/2002 Tanaka et al. ......... 365/185.22

* cited by examiner

Primary Examiner—M. Tran
(74) Attorney, Agent, or Firm—Renner, Otto, Boisselle & Sklar (57) ABSTRACT

A method of detecting a charge stored on a charge storage region of a first dual bit dielectric memory cell within an array of dual bit dielectric memory cells comprises applying a source voltage to a first bit line that is the source of the selected memory cell and applying a drain voltage to a second bit line that forms a drain junction with the channel region. The source voltage may be a small positive voltage and the drain voltage may be greater than the source voltage. A read voltage is applied to a selected one of the word lines that forms a gate over the charge storage region and a bias voltage is applied to non-selected word lines in the array. The bias voltage may be a negative voltage.

20 Claims, 4 Drawing Sheets

| BIT LINE | CORE | 1 | 2 | 3 | 4 | 5 | 6 |
|---|---|---|---|---|---|---|---|
| SOURCE BIT LINE BL(1) | SOURCE | SOURCE | SOURCE | SOURCE | SOURCE | SOURCE | SOURCE |
| DRAIN BIT LINE BL(2) | DRAIN | DRAIN | DRAIN | DRAIN | DRAIN | DRAIN | DRAIN |
| BL(3) | | FLOAT | FLOAT | FLOAT | FLOAT | FLOAT | FLOAT |
| BL(4) | | PRECHARGE | PRECHARGE | FLOAT | FLOAT | FLOAT | FLOAT |
| BL(5) | | — | PRECHARGE | PRECHARGE | PRECHARGE | FLOAT | FLOAT |
| BL(6) | | — | — | — | PRECHARGE | FLOAT | FLOAT |
| ⋮ | | — | — | — | — | FLOAT | FLOAT |
| BL(n) | | — | — | — | — | FLOAT | FLOAT |
| BL(n + 1) | | — | — | — | — | PRECHARGE | PRECHARGE |
| ⋮ | | — | — | — | — | — | PRECHARGE |
| BL(n + x) | | — | — | — | — | — | PRECHARGE |

| WORD LINE | VOLTAGE |
|---|---|
| SELECTED WORD LINE 90 | READ VOLTAGE 94 |
| UNSELECTED WORD LINES 90 | READ Bias VOLTAGE 96 |

FIG. 5b

| BIT LINE | CORE | 1 | 2 | 3 | 4 | 5 | 6 |
|---|---|---|---|---|---|---|---|
| SOURCE BIT LINE BL(1) | SOURCE | SOURCE | SOURCE | SOURCE | SOURCE | SOURCE | SOURCE |
| DRAIN BIT LINE BL(2) | DRAIN | DRAIN | DRAIN | DRAIN | DRAIN | DRAIN | DRAIN |
| BL(3) | | FLOAT | FLOAT | FLOAT | FLOAT | FLOAT | FLOAT |
| BL(4) | | PRECHARGE | PRECHARGE | FLOAT | FLOAT | FLOAT | FLOAT |
| BL(5) | | — | PRECHARGE | PRECHARGE | FLOAT | FLOAT | FLOAT |
| BL(6) | | — | — | PRECHARGE | PRECHARGE | FLOAT | FLOAT |
| ... | | | | | | | |
| BL(n) | | — | — | — | — | PRECHARGE | FLOAT |
| ... | | | | | | | |
| BL(n+1) | | — | — | — | — | — | PRECHARGE |
| BL(n+x) | | — | — | — | — | — | PRECHARGE |

FIG. 4

METHOD FOR READING A NON-VOLATILE MEMORY CELL

TECHNICAL FIELD

The present invention relates generally to flash memory cell devices and more specifically, to improvements in pre-charge reading methods for reading a charge previously stored in a dual bit dielectric memory cell structure.

BACKGROUND OF THE INVENTION

Conventional floating gate flash memory types of EEPROMs (electrically erasable programmable read only memory), utilize a memory cell characterized by a vertical stack of a tunnel oxide ($SiO_2$), a polysilicon floating gate over the tunnel oxide, an interlayer dielectric over the floating gate (typically an oxide, nitride, oxide stack), and a control gate over the interlayer dielectric positioned over a crystalline silicon substrate. Within the substrate are a channel region positioned below the vertical stack and source and drain diffusions on opposing sides of the channel region.

The floating gate flash memory cell is programmed by inducing hot electron injection from the channel region to the floating gate to create a non volatile negative charge on the floating gate. Hot electron injection can be achieved by applying a drain to source bias along with a high control gate positive voltage. The gate voltage inverts the channel while the drain to source bias accelerates electrons towards the drain. The accelerated electrons gain 5.0 to 6.0 eV of kinetic energy which is more than sufficient to cross the 3.2 eV Si—$SiO_2$ energy barrier between the channel region and the tunnel oxide. While the electrons are accelerated towards the drain, those electrons which collide with the crystalline lattice are re-directed towards the Si—$SiO_2$ interface under the influence of the control gate electrical field and gain sufficient energy to cross the barrier.

Once programmed, the negative charge on the floating gate disburses across the semi conductive gate and has the effect of increasing the threshold voltage of the FET characterized by the source region, drain region, channel region, and control gate. During a "read" of the memory cell, the programmed, or non-programmed, state of the memory cell can be detected by detecting the magnitude of the current flowing between the source and drain at a predetermined control gate voltage.

More recently dielectric memory cell structures have been developed. A conventional array of dielectric memory cells 10a–10f is shown in cross section in FIG. 1. Each dielectric memory cell is characterized by a vertical stack of an insulating tunnel layer 18, a charge trapping dielectric layer 22, an insulating top oxide layer 24, and a polysilicon control gate 20 positioned on top of a crystalline silicon substrate 15. Each polysilicon control gate 20 may be a portion of a polysilicon word line extending over all cells 10a–10f such that all of the control gates 20a–20g are electrically coupled.

Figure 1:
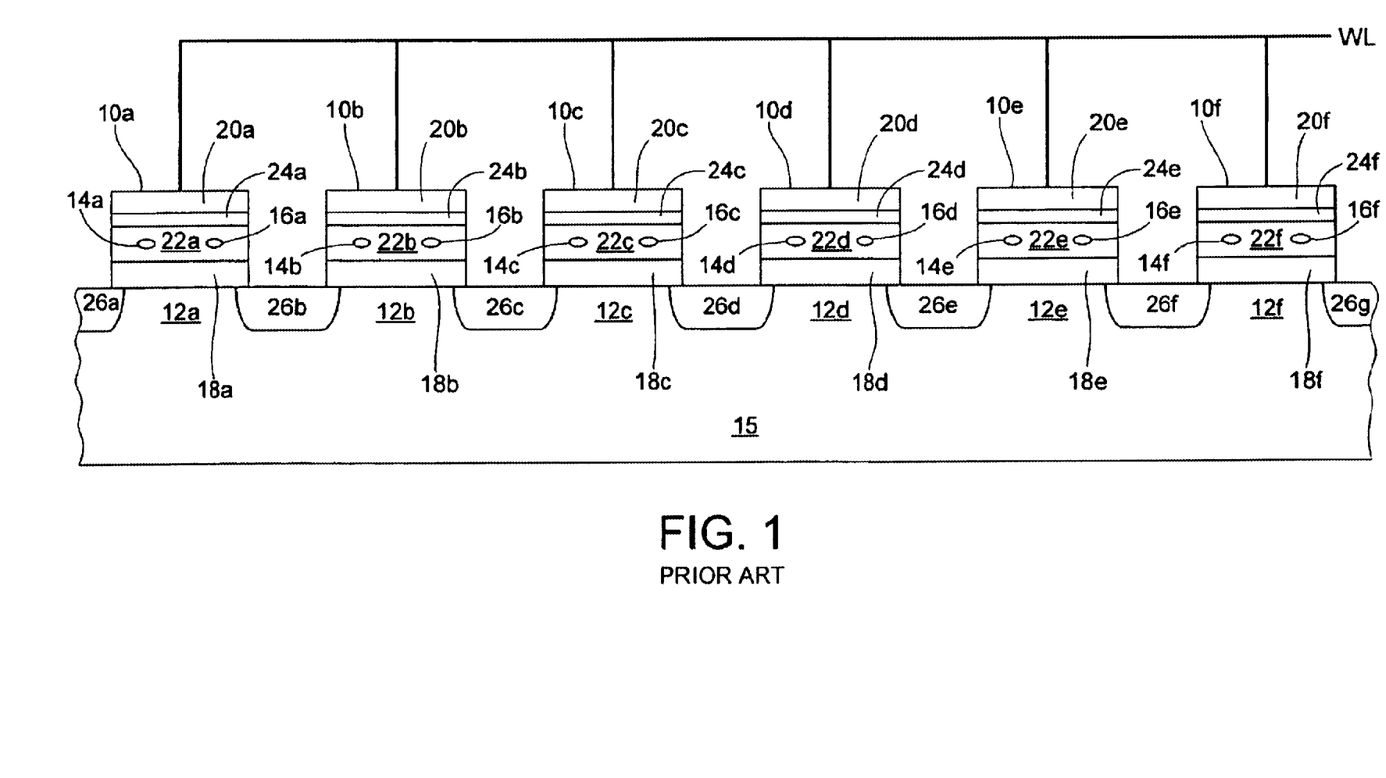
FIG. 1 is a schematic, cross sectional view of a dielectric memory cell array known in the prior art.

Within the substrate 15 is a channel region 12 associated with each memory cell 10 that is positioned below the vertical stack. One of a-plurality of bit line diffusions 26a–26g separate each channel region 12 from an adjacent channel region 12. The bit line diffusions 26 form the source region and drain region of each cell 10. This particular structure of a silicon channel region 22, tunnel oxide 12, nitride 14, top oxide 16, and polysilicon control gate 18 is often referred to as a SONOS device.

Similar to the floating gate device, the SONOS memory cell 10 is programmed by inducing hot electron injection from the channel region 12 to the charge trapping dielectric layer 22, such as silicon nitride, to create a non volatile negative charge within charge traps existing in the nitride layer 22. Again, hot electron injection can be achieved by applying a drain-to-source bias along with a high positive voltage on the control gate 20. The high voltage on the control gate 20 inverts the channel region 12 while the drain-to-source bias accelerates electrons towards the drain region. The accelerated electrons gain 5.0 to 6.0 eV of kinetic energy which is more than sufficient to cross the 3.2 eV Si—$SiO_2$ energy barrier between the channel region 12 and the tunnel oxide 18. While the electrons are accelerated towards the drain region, those electrons which collide with the crystalline lattice are re-directed towards the Si—$SiO_2$ interface under the influence of the control gate electrical field and have sufficient energy to cross the barrier. Because the nitride layer stores the injected electrons within traps and is otherwise a dielectric, the trapped electrons remain localized within a drain charge storage region that is close to the drain region. For example, a charge can be stored in a drain bit charge storage region 16b of memory cell 10b. The bit line 26b operates as the source region and bit line 26c operates as the drain region. A high voltage may be applied to the channel region 20b and the drain region 26c while the source region 26b is grounded.

Similarly, a source-to-drain bias may be applied along with a high positive voltage on the control gate to inject hot electrons into a source charge storage region that is close to the source region. For example, grounding the drain region 26c in the presence of a high voltage on the gate 20b and the source region 26b may be used to inject electrons into the source bit charge storage region 14b.

As such, the SONOS device can be used to store two bits of data, one in each of the source charge storage region 14 (referred to as the source bit) and the charge storage region 16 (referred to as the drain bit).

Due to the fact that the charge stored in the storage region 14 only increases the threshold voltage in the portion of the channel region 12 beneath the storage region 14 and the charge stored in the storage region 16 only increases the threshold voltage in the portion of the channel region 16 beneath the storage region 16, each of the source bit and the drain bit can be read independently by detecting channel inversion in the region of the channel region 12 between each of the storage region 14 and the storage region 16. To "read" the drain bit, the drain region is grounded while a voltage is applied to the source region and a slightly higher voltage is applied to the gate 20. As such, the portion of the channel region 12 near the source/channel junction will not invert (because the gate 20 voltage with respect to the source region voltage is insufficient to invert the channel) and current flow at the drain/channel junction can be used to detect the change in threshold voltage caused by the programmed state of the drain bit.

Similarly, to "read" the source bit, the source region is grounded while a voltage is applied to the drain region and a slightly higher voltage is applied to the gate 20. As such, the portion of the channel region 12 near the drain/channel junction will not invert and current flow at the source/channel junction can be used to detect the change in threshold voltage caused by the programmed state of the source bit.

In a typical flash memory array, the row and column structure creates problems when reading a selected cell. Each memory cell within a column shares a common source bit line and drain bit line with other memory cells within the column. As such, if other cells within the column leak current between the source bit line and the drain bit line, the current flow may not accurately represent only the current drawn from grounded bit line through the channel region of the selected cell. The current may also represent leakage through other cells within the column and therefore the state of the selected cell may be mis-read. As memory array applications demand smaller memory cells structures, the short channel effects of the smaller cell structure increases the likelihood of a punch-through phenomena for the non-selected cells within a selected column.

Further, each memory cell within a row shares a common word line with other cells within the row. As such, leakage through the channel region of one of the cells adjacent to the selected cell in the same row (e.g. one of the cells that shares common bit line with the selected cell) may also cause the state of the selected cell to be mis-read.

What is needed is an improved method for reading a dual bit dielectric memory cell that does not suffer the disadvantages of the known methods.

SUMMARY OF THE INVENTION

A first aspect of the present invention is to provide a method of detecting a charge stored on a source charge storage region of a selected dual bit dielectric memory cell within an array of dual bit dielectric memory cells. The array comprises columns of alternating parallel bit lines, of a first conductivity semiconductor, and channel regions, of an opposite conductivity semiconductor. The bit lines form a source and a drain for each cell within a column. A plurality of parallel word lines, arranged in rows that are perpendicular to the columns, form a gate for each cell within the row.

The method of detecting the charge stored on a source charge storage region comprises applying a source voltage to a first bit line that forms a source junction with a channel region of the selected memory cell, applying a positive drain voltage to a second bit line that forms a drain junction with the channel region, applying a positive read voltage to the selected one of the word lines that forms a gate of the selected memory cell, applying a bias voltage to the non-selected word lines (e.g the word lines other than the selected word line), and detecting current flow at the second bit line.

The source voltage may be ground or a small positive voltage on the order of 0.0 volt to 1.0 volt, the read voltage on the gate may be greater than the source voltage—on the order of 10 volts, and the bias voltage may be a negative voltage. More specifically, the bias voltage may be a negative voltage between −0.1 volt and −2.0 volt; or for a more narrow range, between −0.1 volt and −0.5 volt; or for a more narrow range yet, between −0.1 volt and −0.2 volt.

The above described steps are intended to prevent punch-through leakage of current through non-selected memory cells that share the same column as the selected memory cell within the array. It is also envisioned that the above described steps may be combined with the following steps intended to prevent leakage of current through non-selected cells that share the same row as the selected cell and are adjacent to the selected cell (e.g. sharing a bit line). Such steps include isolating, or floating, a third bit line such that its potential is effected only by its junctions with the a second channel region and a third channel region on opposing sides of the third bit line (the third bit line being the next bit line to the right of the second bit line and separated from the second bit line by only the second channel region and the channel region being to the right of the third bit line) and applying a positive bias voltage to a pre-charge bit line. The pre-charge bit line may be a fourth bit line that is the next bit line to the right of the third bit line and separated from the third bit line by only a third channel region.

A second aspect of the present invention is to provide an array of dual bit dielectric memory cells. The array comprises: a) a first bit line of a first conductivity semiconductor forming a source region for each of a plurality of memory cells within a column of memory cells within the array; b) a first channel region of an opposite conductivity semiconductor forming a channel region for each of the plurality of memory cells within the column; c) a second bit line of the first conductivity semiconductor forming a drain region for each of the plurality of memory cells within the column, the second bit line separated from the first bit line by only the first channel region; d) a selected word line positioned over the channel region and forming a gate for each for a plurality of memory cells within a row of memory cells within the array; e) a plurality of non-selected word lines, each parallel to the selected word line and each forming a gate for each of a plurality of memory cells within a row of non-selected memory cells within the array; f) a word line control circuit; g) a bit line control circuit; and h) a current sensor circuit for detecting the state of the stored charge in a source charge storage region by detecting current flow at the second bit line.

The word line control circuit provides for applying a positive read voltage—on the order of 10 volts—to the selected word line and a bias voltage to the non-selected word lines. The bias voltage may be a negative voltage. More specifically, the bias voltage may be a negative voltage between −0.1 volt and −2.0 volt; or for a more narrow range, between −0.1 volt and −0.5 volt; or for a more narrow range yet, between −0.1 volt and −0.2 volt.

The bit line control circuit provides for applying a source voltage to the source bit line and a positive drain voltage to the drain bit line. The source voltage may be ground or may be a small positive voltage between 0.0 volts and 1.0 volts.

The array may further comprise: i) a second channel region adjacent to the second bit line and forming a junction with the second bit line; j) a third bit line adjacent to the second channel region and forming a junction with the second channel region, the third bit line separated from the second bit line by only the second channel region; k) a third channel region adjacent to the third bit line and forming a junction with the third bit line; and l) a pre-charge bit line to the right of the third channel region which may be a fourth bit line that forms a junction with the third channel region. In which case, the bit line control circuit may further provide for: i) isolating the third bit line such that its potential is effected only by its junctions with the a second channel region and the third channel region; and ii) applying a positive voltage to the pre-charge bit line.

For a better understanding of the present invention, together with other and further aspects thereof, reference is made to the following description, taken in conjunction with the accompanying drawings. The scope of the invention is set forth in the appended clams.

DESCRIPTION OF THE PREFERRED EMBODIMENTS

The present invention will now be described in detail with reference to the drawings. In the drawings, like reference numerals are used to refer to like elements throughout. Further, the diagrams are not drawn to scale and the dimensions of some features are intentionally drawn larger than scale for purposes of showing clarity.

Figure 2:
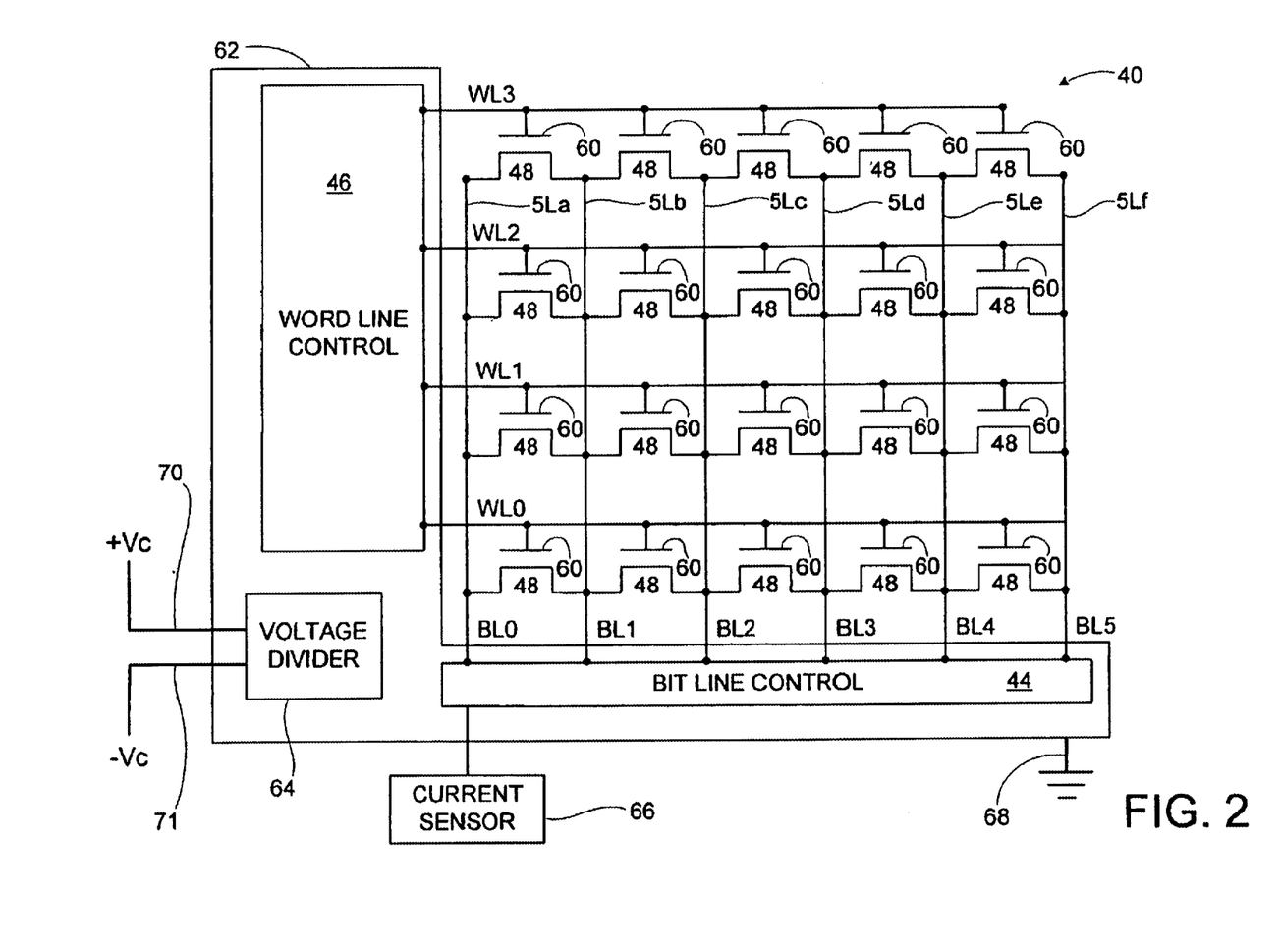
FIG. 2 is a schematic, block diagram view of a dielectric memory cell array in accordance with one embodiment of the present invention.

FIG. 2 shows an exemplary embodiment of a dual bit dielectric memory cell array 40 in block diagram form. The array 40 comprises a plurality of dual bit dielectric memory cells 48, an array control circuit 62, and a current sense circuit 66 fabricated on a crystalline semiconductor substrate. The array of dual bit dielectric memory cells 48 is arranged in a matrix format with horizontal rows of polysilicon word lines WL(0)–WL(3) and vertical columns of alternating bit line diffusions BL(0)–BL(5) and channel regions 50 within the substrate 42. Each cell 48 within a column shares the same channel region 50 and the two bit lines adjacent to, and forming a junction with, the channel region with other cells 48 in the column. Each cell 48 within a row shares the same word line WL(0)–WL(3) with other cells 48 in the row.

Figure 3:
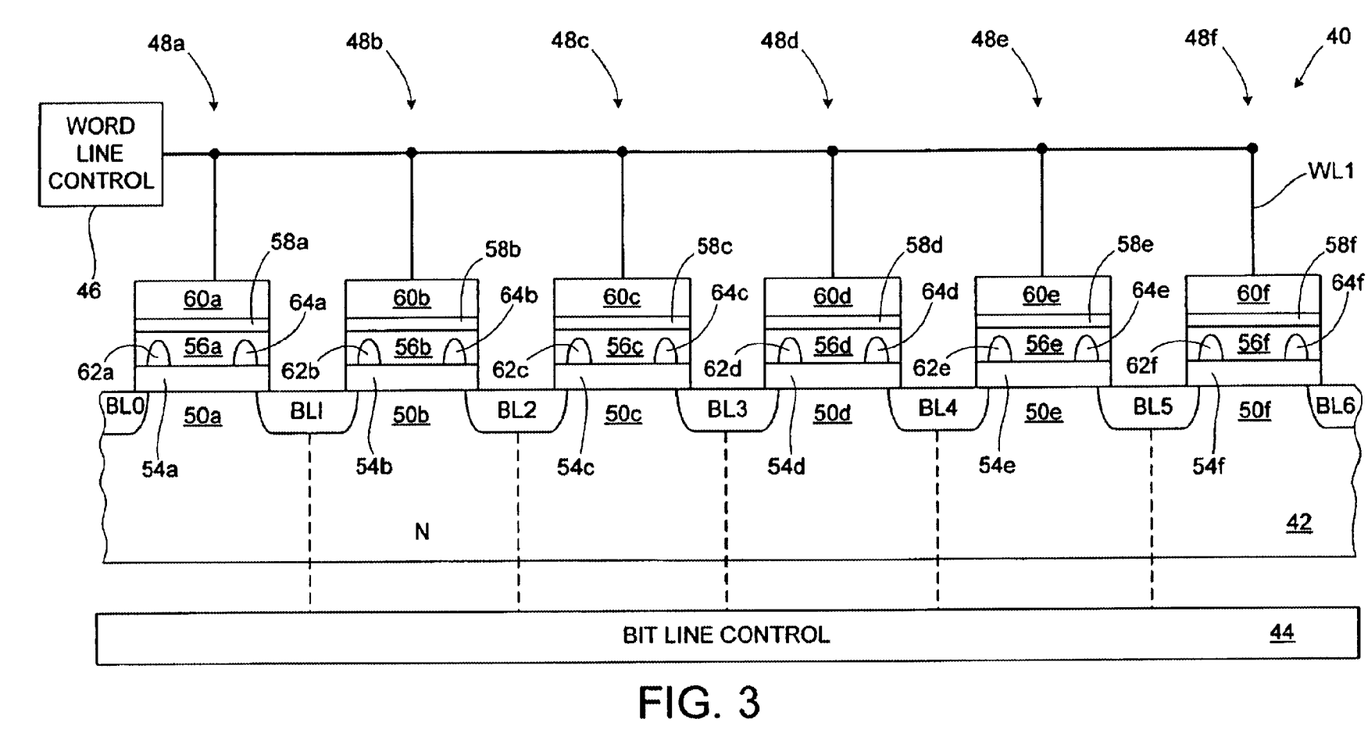
FIG. 3 is a schematic, cross sectional view of the dielectric memory cell array of FIG. 2.

Reference is now made to the cross section diagram representing a row of dual bit dielectric memory cells which share a common word line, WL(1), as shown in FIG. 3 in conjunction with the FIG. 2. It should be appreciated that the polysilicon word line WL(1) is structured to form a control gate 60 over each cell 48 in the row. The bit line diffusions BL(0)–BL(6) are of opposite semiconductor conductivity as the channel regions 50 such that the bit line diffusions BL(0)–BL(6) form a source region and a drain region for each cell in the column. In the exemplary n-mos device, the channel region 50 is an p-type semiconductor such as crystalline silicon lightly implanted with a hole donor impurity such boron and the bit line diffusions BL(0)–BL(6) are an n-type semiconductor such as crystalline silicon implanted with an electron donor impurity such as arsenic.

Above the channel region 50 is a first insulating barrier or tunnel layer 54 which may comprise silicon dioxide. The thickness of the tunnel layer 54 may be within a range of about 50 to about 150 angstroms. An embodiment with a more narrow bracket includes a tunnel layer 54 thickness within a range of about 60 to about 90 angstroms and even narrower yet, a tunnel layer 54 with a thickness of about 70 to about 80 angstroms.

Above the tunnel layer is a charge trapping layer 56 that includes both a source charge trapping region or source bit 62 and a drain charge trapping region or drain bit 64 each for storing a neutral charge representing an un-programmed state or a negative charge representing a programmed state. The charge trapping layer 56 may comprise a nitride compound with suitable charge trapping properties and may have a thickness on the order of 20 to 100 angstroms. In the exemplary embodiment, the nitride compound may be selected from the group consisting of $Si_2N_4$, $Si_3N_4$ and $SiO_xN_4$.

Above the charge trapping layer 56 is a top dielectric layer 58. The top dielectric layer 58 may be silicon dioxide or may be a material with a dielectric constant greater than the dielectric constant of silicon dioxide (e.g. a high K material). In a preferred embodiment, the high K material may be selected from the group of materials consisting of $Al_2O_3$, $HfSi_xO_y$, $HfO_2$, $ZrO_2$, and $ZrXi_xO_y$ and other materials with similarly high dielectric constants. If the top dielectric layer 58 is silicon dioxide, the layer 58 may have a thickness on the order of 60 to 100 angstroms. Alternatively, if the top dielectric layer 58 is a high K material, its electrical thickness may be on the order of 60 to 100 angstroms while its physical thickness may be within a range of about 70 to 130 angstroms. An embodiment with a more narrow bracket includes a top dielectric layer 58 with a thickness within a range of about 80 to about 120 angstroms and even narrower yet, a top dielectric layer 58 with a thickness of about 90 to about 100 angstroms.

Above the top dielectric layer 58 is the word-line WL(1) forming the gate 60 over each cell 48a–48f. In the exemplary embodiment, the gate 60 may comprises polysilicon with a thickness on the order of 4,000 angstroms. The word-line WL(1) is coupled to the word line control circuit 46.

The array control circuit comprises a word line control circuit 46, a bit line control circuit 44, a voltage divider circuit 64, a coupling to a positive operating power source (Vc) 70, a coupling to a negative operating power source (–Vc) 71, and a coupling to a ground 68. In operation, the array control circuit operates to selectively couple each word line WL(0)–WL(3) and each bit line BL(0)–BL(6) to a voltage provided by the voltage divider 64 or to ground (or to isolate the word line WL(0)–WL(3) or bit line BL(0)–BL(6) from all voltage sources and ground such that is potential is effected only by electrical interaction with other structure of the array 40). The coupling is in such a manner that each source charge trapping region 62 and each drain charge trapping region 64 within the array 40 can be erased, selectively programmed, and selectively read. The array control circuit also operates to couple a selected bit line to the current sensor 66 such that a current on the selected bit line may be measured to indicate the programmed state of a selected source charge trapping region 62 or drain charge trapping region 64 of a cell within a column of cells in which such selected bit line is either a source or a drain.

The current sensor 66 may utilize known circuits for sensing current on the selected bit line that is coupled to the current sensor 66 by the bit line control circuit 44. The current sensed represents the programmed state of a selected one of a source charge trapping region 62 or a drain charge trapping region 64 when applicable potentials are coupled to applicable word lines and bit lines by the array control circuit 62 for reading the selected charge trapping region as described in more detail herein.

Array Control Circuit

Figure 4:
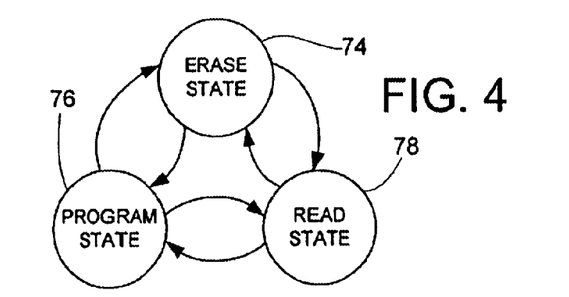
FIG. 4 is a state machine diagram representing exemplary operation of an array control circuit.

Turning briefly to FIG. 4 in conjunction with FIG. 2 and FIG. 3, the array control circuit 62 operates in three states, a program state 76 where in charge is selectively stored into the source charge trapping region 62 or the drain charge trapping region 64 of a selected one of the memory cells 48, a read state 78 wherein a stored charge is detected from the source charge trapping region 62 or the drain charge trapping region 62 of a selected one of the memory cells 48 to reproduce data originally stored in such charge trapping region, and an erase state 78 wherein charge stored in charge trapping regions 62 and 64 of one or more memory cells 48 is removed prior to reprogramming in the program state 76.

When in the program state 76, the source charge trapping region 62 is programmed by injecting electrons into the source charge trapping region 62 using a hot electron injection technique. More specifically, the array control circuit 62 couples bit lines BL(0)–BL(6) and word lines WL(0)–WL(3) to various potentials (e.g provided by the voltage divider 64 and ground 68) to apply a high source-to-drain bias while applying a high voltage to the control gate 60. For example, referring to cell 48b, this may be accomplished by the bit line control circuit 44 coupling the bit line BL(2), which represents the drain region of cell 48b, to ground 68 and coupling the bit line BL(1), which represents the source region of cell 48b, to-a voltage source from the voltage divider 64 of approximately 5 volts. Simultaneously, word line control circuit 46 couples the selected word line WL(1), representing the control gate 60, to a voltage source form the voltage divider 64 of approximately 10 volts and may couple non-selected word lines (e.g. the word lines other than the selected word line WL(1) to a small negative voltage to prevent punch-through current leakage through non-selected memory cells that share the same column as the selected memory cell 48b. The voltage on the control gate 60 inverts the channel region 50b while the high source-to-drain bias draws and accelerates electrons from the drain region BL(2) into the channel region 50b towards the source region BL(1).

The 4.5 eV to 5 eV kinetic energy gain of the electrons is more than sufficient to surmount the 3.1 eV to 3.5 eV energy barrier at channel region 50b/tunnel layer 54b interface and, while the electrons are accelerated towards source region BL(1), the field caused by the high voltage on control gate 60b redirects the electrons towards the source charge trapping region 62b. Those electrons that cross the interface into the source charge trapping region 62b remain trapped within the charge trapping layer 56b for later reading.

Similarly, the drain charge trapping region 64 is programmed by injecting electrons into the drain charge trapping region 64 using a hot electron injection technique. More specifically, the array control circuit 62 couples bit lines BL(0)–BL(6) and word lines WL(0)–WL(3) to various potentials (e.g provided by the voltage divider 64 and ground 68) to apply a high drain-to-source bias while applying a high voltage to the control gate 60. For example, referring to cell 48b, this may be accomplished by the bit line control circuit 44 coupling the bit line BL(1), which represents the source region of cell 48b, to ground 68 and the bit line control circuit 44 coupling the bit line BL(2), which represents the drain region of cell 48b, to a voltage source from the voltage divider 64 of approximately 5 volts. Simultaneously, the word line control circuit 46 couples the selected word line WL(1), representing the control gate 60, to a voltage source form the voltage divider 64 of approximately 10 volts and may couple non-selected word lines (e.g. the word lines other than the selected word line WL(1) to a small negative voltage to prevent punch-through current leakage through non-selected memory cells that share the same column as the selected memory cell 48b. The voltage on the control gate 60 inverts the channel region 50b while the high drain-to-source bias draws and accelerates electrons from the source region BL(1) into the channel region 50b towards the drain region BL(2).

Again, the 4.5 eV to 5 eV kinetic energy gain of the electrons is more than sufficient to surmount the 3.1 eV to 3.5 eV energy barrier at channel region 52b/tunnel layer 54b interface and, while the electrons are accelerated towards drain region 52c, the field caused by the high voltage on control gate 60b redirects the electrons towards the drain charge trapping region 64b.

When in the erase state 74, the array control circuit may couple applicable bit lines BL(0)–BL(6) and word lines 72 to applicable potentials such that the source charge trapping region 62 and the drain charge trapping region 64 of multiple cells are erased using either a hot hole injection technique or by tunneling the electrons from the charge trapping layer 56 to the gate 60 or to the substrate. Both techniques are known in the art.

When in the read state 78, the presence of trapped electrons (e.g a negative charge representing a programmed state) in a selected source charge trapping region 62 or drain charge trapping region 64 is detected. It is recognized that the presence of trapped electrons within a source charge trapping region 62 or a drain charge trapping region 64 effect accumulation within the channel region 50 below such charge trapping regions. As such, the presence of trapped electrons in either the source charge trapping region 62 or the drain charge trapping region 64 effect the threshold voltage of a field effect transistor (FET) characterized by the control gate 60, a bit line diffusion BL(0)–BL(6) that functions as a source region, and a bit line diffusion BL(0)–BL(6) that functions as a drain region. Therefore, each bit of the dual bit memory cell 48 may be "read", or more specifically, the presence of electrons stored within each of the source charge trapping region 62 and the drain charge trapping region 64 may be detected by operation of the FET.

In particular, the presence of electrons stored within a source charge trapping region 62 may be detected by applying a positive voltage to the control gate 60 and a lesser positive voltage to the bit line that functions as the drain region while the bit line that functions as the source region is grounded. The current flow is then measured at the bit line that functions as either the source region or the drain region. Assuming proper voltages and thresholds for measurement (and assuming no current leakage from adjacent memory cells 48 within the same row as the selected cell 48 and assuming no current leakage from memory cells 48 within the same column as the selected cell 48) if there are electrons trapped within the source charge trapping region 62, no measurable current will be measured at the bit line comprising the drain region. Otherwise, if the source charge trapping region 62 is charge neutral (e.g., no trapped electrons) then there will be a measurable current flow into the bit line functioning as the drain region. Similarly, the presence of electrons stored within the drain charge trapping region 64 may be detected by the same method, and merely reversing the bit line functioning as the source region and the bit line functioning as the drain region.

Recognizing that current leakage from non-selected memory cells that share the same column as the selected memory cell may effect accurate reading, the array control circuit 62 may apply bias voltages to non-selected word lines and/or the bit line forming the source region of the column to prevent such leakage.

Figure 5A:
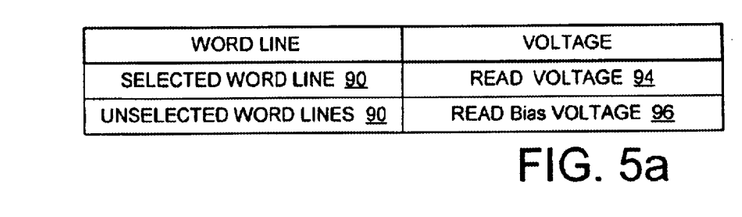
FIG. 5a is a table representing exemplary operating embodiments of a bit line control circuit of an array control circuit in accordance with this invention.

The table of FIG. 5a represents exemplary operation of the word line control circuit 46 for applying bias voltages in accordance with the present invention. Referring to FIG. 5a in conjunction with FIG. 3, when reading the source charge trapping region of a selected memory cell, the word line control circuit 46 will couple the selected word line 90 to a positive read voltage 94, on the order of 10 volts, from the voltage divider 64 and couple the non-selected word lines (e.g. all word lines other than the selected word line) to a read bias voltage 96 from the voltage divider 64 in order to prevent punch through current leakage through the memory cells that share the same column as the selected memory cell. The read bias voltage 96 may be a negative voltage.

More specifically, the read bias voltage 96 may be a negative voltage between −0.1 volt and −2.0 volt; or for a more narrow range, between −0.1 volt and −0.5 volt; or for a more narrow range yet, between −0.1 volt and −0.2 volt.

Figure 5B:
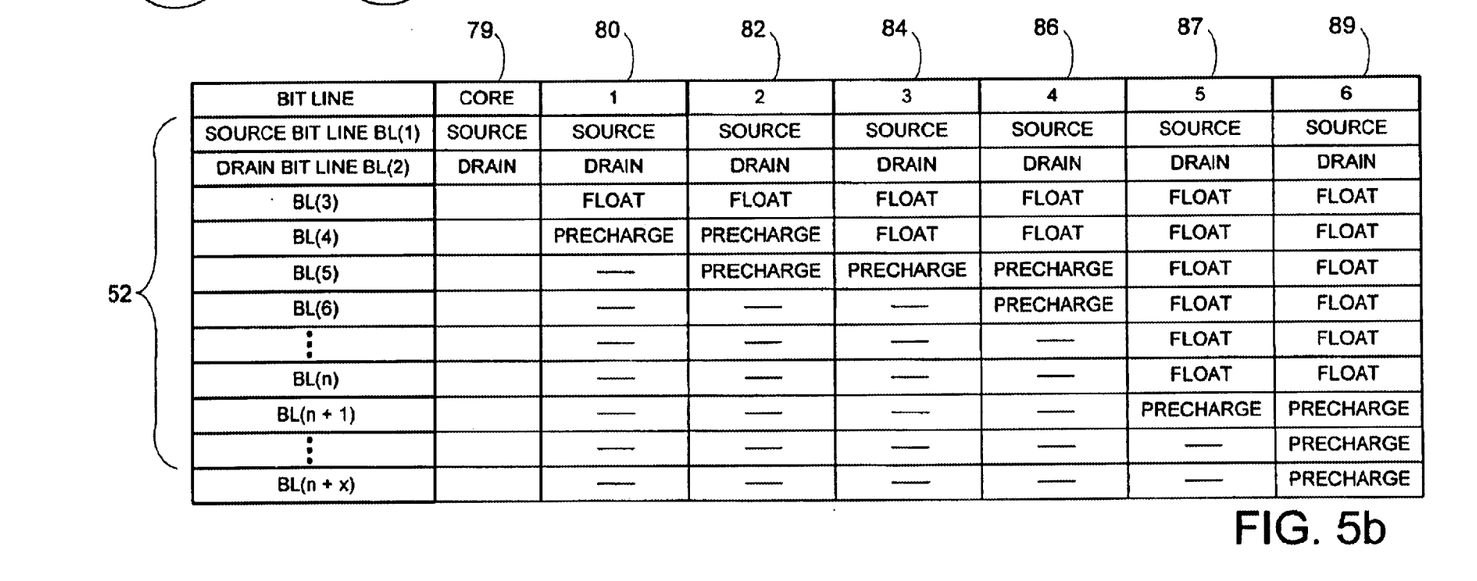
FIG. 5b is a table representing exemplary operating embodiments of a word line control circuit of an array control circuit in accordance with this invention.

The table of FIG. 5b represents exemplary operation of the bit line control circuit 44 for applying voltages to the bit lines BL(0)–BL(6) in accordance With the present invention. Referring to FIG. 5b in conjunction with FIG. 2, in the core embodiment 79 of this invention, when reading the source charge trapping region of a selected memory cell, for example cell 48b, the bit line control circuit 44 will couple the bit line BL(1) that represents the source region of cell 48b to a source voltage from the voltage divider 64 and will couple the bit line BL(2) that represents the drain region of cell 48b to both a positive drain voltage from the voltage divider 64 and to the current sensor circuit 66. The drain voltage may be less than or equal to the read voltage 94 applied to the selected word line 90. The source voltage may be ground or may be a small positive voltage between 0.0 volts and 1.0 volts in order to reduce punch-through current leakage through non-selected memory cells 48 that share the same column with the selected cell 48b.

Recognizing that current leakage from adjacent memory cells in the same row as the selected cell may affect accurate reading, the table of FIG. 5b further includes four alternative embodiments 80, 82, 84, and 86 of operation of the bit line control circuit 44 for reading the source charge trapping region 62 of a selected memory cell.

All four alternative embodiments, like the core embodiment, comprise the bit line control circuit 44 coupling the bit line BL(1) that represents the source region of cell 48b to a source voltage from the voltage divider 64 and coupling the bit line BL(2) that represents the drain region of cell 48b to both a positive drain voltage from the voltage divider 64 and to the current sensor circuit 66.

In addition, exemplary embodiment 80 comprises the bit line control circuit 44 isolating the next bit line to the right of the drain bit line, referred to as BL(3), such that its potential may float while being effected only by its junctions with each of the channel regions 50 on opposing sides of the bit line (e.g channel regions 50c and 50d in the example of reading source bit 62b).

The bit line control circuit couples the next bit line to the right of BL(3), referred to as BL(4), to a pre-charge voltage from the voltage divider circuit 64 such that it is neutral biased to the control gate 60 and positive biased with respect to the source bit line BL(1). Because BL(4) is coupled to a pre-charge voltage, it may be referred to as a pre-charged bit line.

The exemplary embodiment 82 comprises the bit line control circuit 44 isolating the next bit line to the right of the drain bit line (e.g. isolates the bit line BL(3) in the table of FIG. 5b) such that its potential may float while being effected only by its junctions with each of the channel regions 50 on opposing sides of the bit line BL(3).

The bit line control circuit 44 couples the next two bit lines (e.g. BL(4) and BL(5)) to the right of floating bit line BL(3) to the pre-charge voltage from the voltage divider 64 such that both of these pre-charged bit lines are neutral biased to the control gate 60 and positive biased with respect to the source bit line BL(1).

The exemplary embodiment 84 comprises the bit line control circuit 44 isolating the next two bit lines to the right of the drain bit line (e.g. isolates the bit lines BL(3) and BL(4) in the table of FIG. 5b) such that the potential of each may float while being effected only by its junctions with each of the channel regions 50 on opposing sides.

The bit line control circuit couples the next bit line (e.g. BL(5)) to the right of the two floating bit lines BL(3) and BL(4) to the pre-charge voltage from the voltage divider such that this pre-charged bit line is neutral biased to the control gate 60 and biased high with respect to the source bit line BL(1).

The exemplary embodiment 86 comprises the bit line control circuit 44 isolating the next two bit lines to the right of the drain bit line (e.g. isolates the bit lines BL(3) and BL(4) in the table of FIG. 4b) such that the potential of each may float while being effected only by its junctions with each of the channel regions 50 on opposing sides.

The bit line control circuit couples the next two bit lines (e.g. BL(5) and BL(6)) to the right of floating bit lines BL(3) and BL(4) to the pre-charge voltage from the voltage divider 64 such that both of these pre-charged bit lines are neutral bias to the control gate 60 and biased high with respect to the source bit line BL(1).

The exemplary embodiment 87 comprises the word line control circuit 46 coupling the word line 72 associated with the cell 48 to be read to the gate voltage source from the voltage divider 64 while coupling adjacent word lines 72 to ground 68. The bit line control circuit 44 couples the bit line 52 that comprises the source region of the cell 48 (e.g. BL(1)) to ground 68 and couples the bit line that comprises the drain region of the cell 48 (e.g. BL(2)) to the high voltage source form the voltage divider 74.

The bit line control circuit 44 isolates the next block of n bit lines (e.g. bit lines BL(3) through BL(n)) to the right of the drain bit line such that the potential of each may float while being effected only by its junctions with each of the channel regions 50 on opposing sides.

The bit line control circuit couples the next bit line (e.g. BL(n+1)) to the right of the floating bit lines, BL(3) through BL(n), to the high voltage source such that this pre-charged bit line is neutral bias to the control gate 60 and biased high with respect to the source bit line BL(1).

The exemplary embodiment 89 comprises the word line control circuit 46 coupling the word line 72 associated with the cell 48 to be read to the gate voltage source from the voltage divider 74 while coupling adjacent word lines to ground. The bit line control circuit 44 couples the bit line 52 that comprises the source region of the cell 48 (e.g. BL(1)) to ground and couples the bit line that comprises the drain region of the cell 48 (e.g. BL(2)) to the high voltage source form the voltage divider 74.

The bit line control circuit 44 isolates the next block of n bit lines (e.g. bit lines BL(3) through BL(n)) to the right of the drain bit line such that the potential of each may float while being effected only by its junctions with each of the channel regions 50 on opposing sides.

The bit line control circuit couples the next group of bit lines (e.g. BL(n+1) through BL(n+x)) to the right of floating bit lines, BL(3) through BL(n) to the high voltage source such that this block of pre-charged bit lines are neutral bias to the control gate 60 and biased high with respect to the source bit line BL(1).

In summary, the method for reading data from a dual bit dielectric memory cell of this invention provides for more accurate reading in view of potential current leakage from memory cells that are within the same column as the selected cell within the array and from adjacent memory cells that share a bit line with the selected cell. Although this invention has been shown and described with respect to certain preferred embodiments, it is obvious that equivalents and modifications will occur to others skilled in the art upon the reading and understanding of the specification. For example, Although the cells of the array are shown as a substantially planar structure formed on the silicon substrate, it should be appreciated that the teachings of this invention may be applied to both planar, fin formed, and other dielectric memory cell structures which may be formed on suitable semiconductor substrates which include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention includes all such equivalents and modifications, and is limited only by the scope of the following claims.

What is claimed is:

1. A method of detecting a charge stored on a source charge storage region of a selected dual bit dielectric memory cell within an array of dual bit dielectric memory cells, the array comprising a plurality of parallel bit lines forming a source and a drain for each cell and a plurality of parallel word lines forming a gate for each cell, the method comprising:

applying a source voltage to a first bit line that forms a source junction with a channel region of the selected memory cell, the channel region being to the right of the first bit line;

applying a positive drain voltage to a second bit line that forms a drain junction with the channel region, the second bit line positioned to the right of the first bit line and separated from the first bit line by only the channel region;

applying a positive read voltage to a selected one of the word lines, the selected one of the word lines being the word line that forms a gate of the selected memory cell;

the read voltage being a positive voltage greater than the source voltage;

applying a bias voltage to non-selected word lines, the non-selected word lines being the word lines other than the selected one of the word lines, the bias voltage being a negative voltage; and detecting current flow at the second bit line.

2. The method of claim 1, wherein:

the source voltage is ground; and the bias voltage is a negative voltage between −0.1 volt and −1.0 volt.

3. The method of claim 2, wherein:

the bias voltage is a negative voltage between −0.1 volt and −0.5 volt.

4. The method of claim 3, wherein:

the bias voltage is a negative voltage between −0.1 volt and −0.2 volt.

5. The method of claim 1, wherein:

the source voltage is a positive voltage between ground and 1.0 volt; and the bias voltage is a negative voltage between −0.1 volt and −2.0 volt.

6. The method of claim 5, further comprising:

isolating a third bit line such that its potential is effected only by its junctions with the a second channel region and a third channel region on opposing sides of the third bit line, the third bit line being the next bit line to the right of the second bit line and separated from the second bit line by only the second channel region and the third channel region being to the right of the third bit line; and applying a positive bias voltage to a pre-charge bit line, the pre-charge bit line being to the right of the third channel region.

7. The method of claim 6, wherein the pre-charge bit line is a fourth bit line that is the next bit line to the right of the third bit line and separated from the third bit line by only a third channel region.

8. The method of claim 7, further comprising applying a high bias voltage to a second pre-charge bit line, the second pre-charge bit line being a fifth bit line that is the next bit line to the right of the fourth bit line and separated from the fourth bit line by only a fourth channel region.

9. The method of claim 6, further comprising isolating a fourth bit line such that its potential is effected only by its junctions with the third channel region and a fourth channel region on opposing sides of the fourth bit line, the fourth bit line being separated from the third bit line by only the third channel region and the fourth channel region being to the right of the fourth bit line;

wherein the pre-charge bit line is a fifth bit line that is positioned to the right of the fourth bit line and separated from the fourth bit line by only the fourth channel region.

10. The method of claim 9, further comprising a high bias voltage to a second pre-charge bit line, the second pre-charge bit line being a sixth bit line that is positioned to the fifth of the fifth bit line and separated from the fifth bit line by only a fifth channel region.

11. An array of dual bit dielectric memory cells, the array comprising:

a first bit line of a first conductivity semiconductor forming a source region for each of a plurality of memory cells within a column of memory cells within the array;

a first channel region of an opposite conductivity semiconductor forming a channel region for each of the plurality of memory cells within the column;

a second bit line of the first conductivity semiconductor forming a drain region for each of the plurality of memory cells within the column, the second bit line separated from the first bit line by only the first channel region;

a selected word line positioned over the channel region and forming a gate for each for a plurality of memory cells within a row of memory cells within the array;

a plurality of non-selected word lines, each parallel to the selected word line and each forming a gate for each of a plurality of memory cells within a row of memory cells within the array;

a word line control circuit for:

applying a positive read voltage to the selected word line;

applying a negative bias voltage to the non-selected word lines;

a bit line control circuit for:

applying a source voltage to the source bit line;

applying a positive drain voltage to the drain bit line; and a current sensor circuit for detecting the state of the stored charge in a source charge storage region by detecting current flow at the second bit line.

12. The array of claim 11, wherein the source voltage is ground; and the bias voltage is a negative voltage between −0.1 volt and −2.0 volt.

13. The array of claim 12, wherein:

the bias voltage is a negative voltage between −0.1 volt and −0.5 volt.

14. The array of claim 13, wherein:

the bias voltage is a negative voltage between −0.1 volt and −0.2 volt.

15. The array of claim 11, wherein:

the source voltage is a positive voltage between ground and 1.0 volt; and the bias voltage is a negative voltage between −0.1 volt and −2.0 volt.

16. The array of claim 15, further comprising:

a second channel region adjacent to the second bit line and forming a junction with the second bit line;

a third bit line adjacent to the second channel region and forming a junction with the second channel region, the third bit line separated from the second bit line by only the second channel region;

a third channel region adjacent to the third bit line and forming a junction with the third bit line;

a pre-charge bit line to the right of the third channel region; and wherein the bit line control circuit further provides for:

isolating the third bit line such that its potential is effected only by its junctions with the a second channel region and the third channel region;

applying a positive voltage to the pre-charge bit line.

17. The array of claim 16, wherein the pre-charge bit line is a fourth bit line that forms a junction with the third channel region.

18. The array of memory cells of claim 17, further comprising:

a fourth channel region adjacent to the fourth bit line and forming a junction with the fourth bit line;

a second pre-charge bit line, the second pre-charge bit line being a fifth bit line that is adjacent to the fourth channel region and forms a junction with the fourth channel region; and wherein the bit line control circuit further provides for applying a high bias voltage to the second pre-charge bit line.

19. The array of memory cells of claim 16:

further comprising:

a fourth bit line adjacent to the third channel region and forming a junction with the third channel region;

a fourth channel region adjacent to the fourth bit line and forming a junction with the fourth bit line;

wherein:

the pre-charge bit line is a fifth bit line that is adjacent to the fourth channel region and forms a junction with the fourth channel region; and the bit line control circuit further provides for isolating the fourth bit line such that its potential is effected only by its junctions with the third channel region and the fourth channel region.

20. The array of memory cells of claim 19, further comprising:

a fifth channel region adjacent to the fifth bit line and forming a junction with the fifth bit line;

a second pre-charge bit line, the second pre-charge bit line being a sixth bit line that is adjacent to the fifth channel region and forming a junction with the fifth channel region; and wherein the bit line control circuit further provides for applying a high bias voltage to the second pre-charge bit line.

* * * * *

UNITED STATES PATENT AND TRADEMARK OFFICE
CERTIFICATE OF CORRECTION

PATENT NO. : 6,795,357 B1
DATED : September 21, 2004
INVENTOR(S) : Liu et al.

It is certified that error appears in the above-identified patent and that said Letters Patent is hereby corrected as shown below:

Column 1,
Line 59, replace "a-plurality" with -- a plurality --

Column 7,
Line 12, replace "to-a" with -- to a --

Signed and Sealed this

First Day of February, 2005

JON W. DUDAS
*Director of the United States Patent and Trademark Office*